(12) United States Patent
Kozyrev

(10) Patent No.: US 10,008,982 B1
(45) Date of Patent: Jun. 26, 2018

(54) PARAMETRICALLY DRIVEN GYROMAGNETIC NONLINEAR TRANSMISSION LINE OSCILLATOR

(71) Applicant: Rockwell Collins, Inc., Cedar Rapids, IA (US)

(72) Inventor: Alexander B. Kozyrev, Madison, WI (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 148 days.

(21) Appl. No.: 15/048,723

(22) Filed: Feb. 19, 2016

(51) Int. Cl.
    H03G 3/20       (2006.01)
    H03B 5/18       (2006.01)
    H03F 7/02       (2006.01)
    H03F 7/04       (2006.01)
    H03G 3/00       (2006.01)

(52) U.S. Cl.
    CPC ............ *H03B 5/1882* (2013.01); *H03F 7/02* (2013.01); *H03F 7/04* (2013.01); *H03G 3/00* (2013.01)

(58) Field of Classification Search
    CPC .... H03F 7/04; H03F 7/02; H03G 3/00; H03B 5/1882

USPC ................. 372/22; 330/278, 144; 333/219
See application file for complete search history.

(56) References Cited

U.S. PATENT DOCUMENTS

| | | | | |
|---|---|---|---|---|
| 3,120,646 A * | 2/1964 | Seidel | ...................... | H03F 7/02 330/4.6 |
| 9,330,836 B2 * | 5/2016 | Vendik | ..................... | H01F 38/14 |
| 2005/0270091 A1 * | 12/2005 | Kozyrev | ................... | H03F 7/00 330/4.5 |
| 2007/0230518 A1 * | 10/2007 | Watanabe | ............ | H04B 10/299 372/22 |
| 2013/0207725 A1 * | 8/2013 | Afshari | ................. | H03B 19/00 330/278 |
| 2016/0156327 A1 * | 6/2016 | Wang | ..................... | H03H 7/461 333/132 |

* cited by examiner

*Primary Examiner* — Arnold Kinkead
(74) *Attorney, Agent, or Firm* — Donna P. Suchy; Daniel M. Barbieri

(57) ABSTRACT

A radio frequency (RF) wave generator includes a nonlinear transmission line and a pulse generator. The nonlinear transmission line has in order an input section, a magnetic section, and an output section. The magnetic section includes a nonlinear magnetic material. The pulse generator is configured to provide an input pulse to the input section which is converted to an RF wave by the nonlinear transmission line. A waveform of the input pulse is such that the generated RF wave is parametrically amplified.

14 Claims, 4 Drawing Sheets

PARAMETRICALLY DRIVEN GYROMAGNETIC NONLINEAR TRANSMISSION LINE OSCILLATOR

The inventive concepts disclosed herein generally relate to the field of gyromagnetic nonlinear transmission lines.

BACKGROUND

Gyromagnetic transmission lines generally include a magnetic material that is axially biased by an external magnetic field. For example, a gyromagnetic transmission line may be a coaxial transmission line filled with ferrite, or some other nonlinear magnetic material, that is axially biased by an external magnetic field. Gyromagnetic nonlinear transmission lines (NLTLs) have been demonstrated in high power microwave (HPM) circuits for radio frequency (RF) pulse generation. Gyromagnetic NLTLs may convert or modulate a flat top rectangular input pulse into an RF pulse during the propagation of the input pulse along the transmission line.

FIG. 1 illustrates a conventional gyromagnetic NLTL 10 with an input section 20, nonlinear magnetic section 30, and output section 40. An input pump pulse 50 is input to the input section 20. As the pump pulse propagates along the line, the RF wave generated becomes progressively longer, while the pump pulse becomes shorter. Part of the energy of the pump pulse converts to the energy of the RF wave and the other part of the energy dissipates at the shock wave front.

SUMMARY

In one aspect, embodiments of the inventive concepts disclosed herein are directed to a radio frequency (RF) wave generator. The wave generator comprises: a nonlinear transmission line having in order an input section, a magnetic section, and an output section, the magnetic section comprising a nonlinear magnetic material; and a pulse generator configured to provide an input pulse to the input section which is converted to an RF wave by the nonlinear transmission line, a waveform of the input pulse being such that the generated RF wave is parametrically amplified.

In a further aspect, embodiments of the inventive concepts disclosed herein are directed to a pulse forming structure providing parametric amplification of gyromagnetic oscillations. The pulse forming structure comprises: a first gyromagnetic nonlinear transmission line (NLTL) comprising a nonlinear magnetic material; a second gyromagnetic NLTL transmission line; a load arranged between the first gyromagnetic NLTL transmission line and the second gyromagnetic NLTL transmission line; a power supply arranged to provide a voltage to the first gyromagnetic NLTL transmission line and the second gyromagnetic NLTL transmission line; and a switch arranged to short circuit the first NLTL transmission line when in a closed position such that a voltage pulse is generated to propagate in the first NLTL transmission line and the second NLTL transmission line to provide transient fields created by multiple reflections of the pulse to parametrically amplify gyromagnetic oscillations in the first NLTL transmission line and the second NLTL transmission line.

In a further aspect, embodiments of the inventive concepts disclosed herein are directed to a method of parametrically amplifying a radio frequency (RF) wave. The method comprises: providing an input pulse to an input section of a nonlinear transmission line having in order the input section, a magnetic section, and an output section, the magnetic section comprising a nonlinear magnetic material; and converting the input pulse to an RF wave via the nonlinear transmission line, a waveform of the input pulse being such that the generated RF wave is parametrically amplified.

DETAILED DESCRIPTION

The input of a rectangular input pulse into a NLTL may produce a relatively short damped sinusoid output RF with several damped oscillations which continuously decrease in amplitude. This damped effect can be explained as follows.

Figure 1:
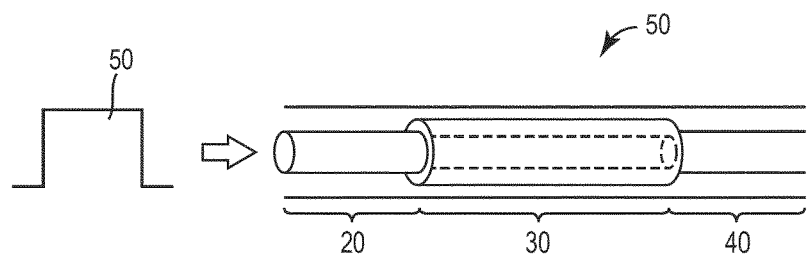
FIG. 1 is a side view illustrating a conventional gyromagnetic NLTL.
Figure 2A:
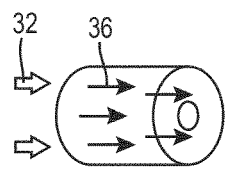
FIG. 2A is a side view of a portion of a nonlinear magnetic section with an applied bias magnetic field, but no applied pulse magnetic field.
Figure 2B:
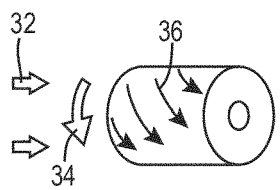
FIG. 2B is a side view of a portion of a nonlinear magnetic section with an applied bias magnetic field, and with an applied pulse magnetic field.

FIG. 2A illustrates a portion 30a of the nonlinear magnetic section 30 with an applied bias magnetic field 32, but no applied pulse magnetic field, while FIG. 2B illustrates a portion 30a of the magnetic section 30 with an applied bias magnetic field 32, and additionally an applied pulse magnetic field 34. The total magnetic field 36 is the vector sum of the applied bias magnetic field 32 and the applied pulse magnetic field 34.

The dynamic relationship between the magnetization vector M and the total magnetic field vector H can be expressed as the following equation: vector magnetic $$\frac{\partial M}{\partial t} = \gamma_0 [M \times H] - \frac{\alpha \gamma_0}{M} [M \times [M \times H]]$$

where M is the magnitude of the magnetization vector M, $\gamma_0$ is the electron gyromagnetic ratio, and a is a dimensionless constant called the damping factor.

Figure 3:
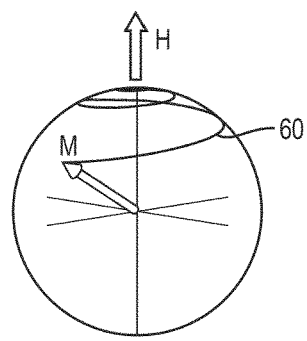
FIG. 3 illustrates the precession of the magnetization vector M about the applied magnetic field vector H along the line of precession.
Figure 4:
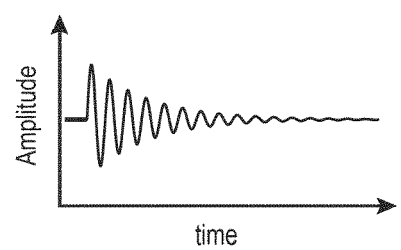
FIG. 4 illustrates a waveform of the output RF at the output of a gyromagnetic NLTL with a rectangular shaped input waveform.

The experimental conditions in conventional gyromagnetic NLTSs correspond to the macrospin approximation, in which all individual electron spins in the magnetic material of the NLTL behave as a combined system. This occurs when the magnetic material is initially magnetized to saturation by an external magnetic field in the direction of wave propagation. This saturation is accomplished in FIGS. 2A and 2B by the applied bias magnetic field which points along the axis of the transmission line. The high power magnetic field transient due to the applied pulse magnetic field 34 forces the magnetization vector M to precess about the direction of the applied magnetic field vector H. This precession of the magnetization vector M about the applied magnetic field vector H is shown in FIG. 3, where the line of precession 60 is shown. The tip of the magnetization vector M follows the line of precession 60. Thus the entire macro-spin system becomes a nonlinear oscillator driven out of stable state by a high power transient field. The precessing field component M couples with the magnetic field of the pumping impulse to produce a modulation of the amplitude of the impulse. Under such experimental conditions, however, a rectangular input pulse with a short leading edge produces only a relatively short damped sinusoid output RF with several damped oscillations which continuously decrease in amplitude due to inherent RF loss when the rectangular input pulse is injected into a gyromagnetic NLTL. FIG. 4 illustrates a waveform of the output RF, which illustrates the waveform of the RF at the output of the gyromagnetic NLTL with a rectangular shaped input waveform.

Parametric Resonance Amplification

In order to compensate for the inherent RF loss when the rectangular input pulse is injected into a gyromagnetic NLTL, and results in a damped sinusoid output RF, the input waveform is chosen to provide for parametric resonance and resulting output RF amplification. Paramagnetic resonance allows for an HPM source which generates long RF pulses in a frequency range typically covered by gyromagnetic NLTLs. This technique provides a physical phenomenon, parametric amplification of gyromagnetic precession, not previously realized in NLTLs.

Parametric amplification is known for linear oscillators, where it is known that the amplitude of a linear oscillator can grow in spite of energy dissipation when an oscillator is periodically driven with an external force at a certain frequency, called the parametric resonance frequency. An example of a parametric oscillator is a child pumping a swing by periodically standing and squatting to increase the size of the swing's oscillations.

The present disclosure discusses parametric resonance in a nonlinear oscillator where the external driving force is generally not a simple periodic function since oscillating frequency depends on the amplitude of oscillation.

Figure 5:
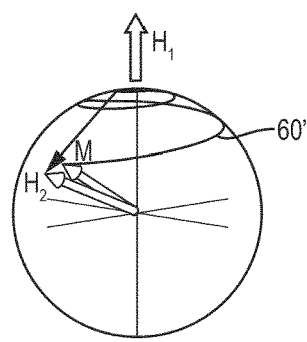
FIG. 5 illustrates the precession of the magnetization vector M along the line of precession in the case of temporally flipping between two net magnetic fields $H_1$ and $H_2$.

A gyromagnetic oscillator can have an external force to provide amplification by temperoral modulation of either the direction or intensity of the net magnetic field H. An example of this concept is illustrated in FIG. 5, which illustrates the gyromagnetic precession of the magnetization vector M in the case of temporally flipping between two net magnetic fields $H_1$ and $H_2$. In this case, parametric amplification of gyromagnetic precession can be observed when the net magnetic field flips between the $H_1$ and $H_2$, which have different directions. The tip of the magnetization vector M follows the line of precession 60'.

Figure 6:
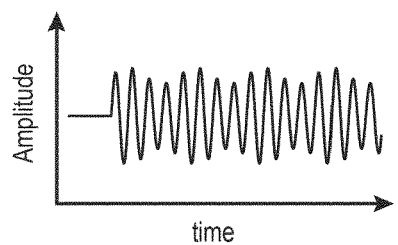
FIG. 6 illustrates a waveform of the output RF in one case of parametric amplification, with an input waveform designed to provide an amplitude of the generated RF wave which is substantially constant.

FIG. 6 illustrates a waveform of the output RF in one case of parametric amplification, which illustrates the waveform of the RF at the output of the gyromagnetic NLTL with an input waveform designed to provide an amplitude of the generated RF wave which is substantially constant. This is in contrast to the RF waveform in FIG. 3, where there is no parametric amplification, and where the amplitude of the output RF waveform steadily decreases.

Paramagnetic amplification may be accomplished through a pulse generator configured to provide an input pulse to the gyromagnetic NLTL which modulates the direction and/or intensity of the net magnetic field along the gyromagnetic NLTL. The pulse generator may be configured to provide the input pulse by being programmed and/or hardwired to provide such a pulse. This modulation promotes efficient parametric energy transfer from the injected input pulse into a waveform of RF oscillations. The input pulse enables functionality not achievable in current RF generator systems employing gyromagnetic NLTLs, such functionality including: (1) a significant increase in the DC to RF efficiency; (2) generation of an output RF waveform with oscillations of substantially equal amplitude; and (3) generation of a significantly large number of oscillations in a pulse for a given gyromagnetic NLTL length, in contrast to the conventional gyromagnetic NLTL where the length of the RF output pulse is proportional to the NLTL length. The nonlinear parametric oscillator disclosed allows for continuous wave (CW) generation of RF in gyromagnetic NLTLs with higher conversion efficiency to RF and larger RF output energy in a short period of time.

RF Wave Generator

Figure 7:
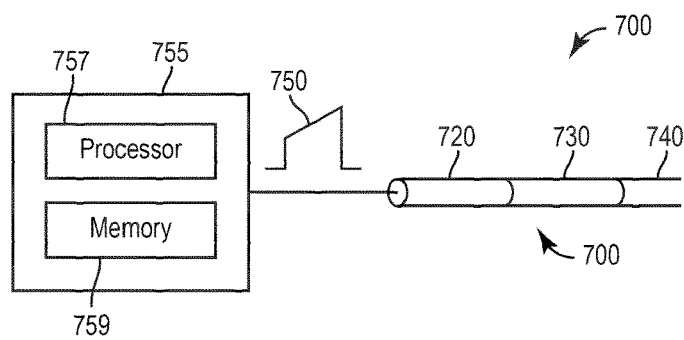
FIG. 7 is a schematic illustrating an RF wave generator according to an embodiment of the inventive concepts disclosed herein.

FIG. 7 is a schematic illustrating an RF wave generator 700 according to an embodiment of the invention. The RF wave generator 700 includes a gyromagnetic nonlinear transmission line 710 and a pulse generator 755. The gyromagnetic nonlinear transmission line has in order an input section 720, a nonlinear magnetic section 730 and an output section 740. The nonlinear magnetic section comprising a nonlinear magnetic material such as ferrite or some other nonlinear magnetic material, for example.

The pulse generator 755 is configured to provide an input pulse 750 to the input section 720, where the input pulse 750 travels along the gyromagnetic nonlinear transmission line 710 from the input section 720, to the nonlinear magnetic section 730, and to the output section 740. The input pulse 750 is converted to an RF wave by the gyromagnetic nonlinear transmission line 720, where a waveform of the input pulse being such that the generated RF wave is parametrically amplified.

The pulse generator 755 is configured to provide an appropriate input pulse 750 for parametric amplification by being programmed and/or hardwired to provide such a pulse. The pulse generator 755 may include a processor 757 and memory 759 which includes a program, which when executed by the processor 757 provides an appropriate input pulse 750 for parametric amplification. Thus, the pulse generator 755 has the structure, such as by being programmed and/or hardwired, to provide an appropriate input pulse 750 for parametric amplification.

Figure 8A:
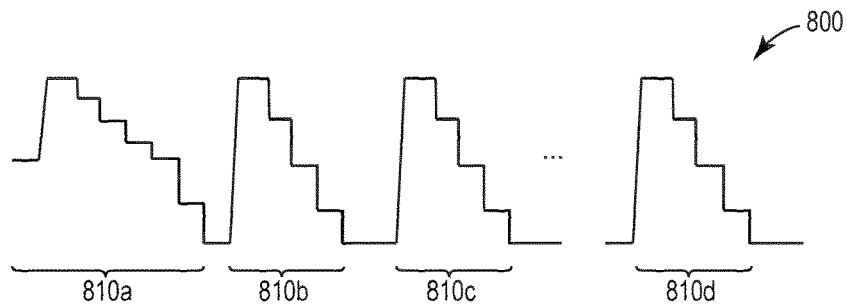
FIG. 8A illustrates an appropriate input waveform for providing parametric amplification according to an embodiment of the inventive concepts disclosed herein.

Input Pulses for Parametric Amplification of Generated RF Wave for a Gyromagnetic NLTL FIG. 8A illustrates an appropriate input waveform 800 for providing parametric amplification of generated RF wave for a gyromagnetic NLTL. In order to enable parametric amplification of gyromagnetic oscillations, the conventional input rectangular pulse is replaced with a waveform modulated by a series of sharp transients. This can be done without the change of the polarity of the pulse as in FIG. 8A, or with a change of polarity, i.e., going from positive to negative and vice versa as in FIG. 9A, or a combination as in FIG. 10A. The interval between the adjacent sharp transients in the waveform is somewhat close to the integer number N of periods of the gyromagnetic oscillations. However this number N can not be larger than the number of oscillations produced by a simple rectangular waveform (as in FIG. 4).

Figure 8B:
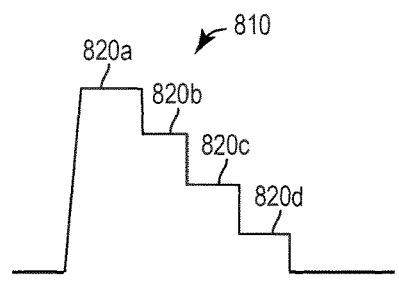
FIG. 8B illustrates a frame of the input waveform of FIG. 8A.

The input waveform may be divided into a plurality of frames 810, such as frames 810a, 810b, 810c and 810d shown in FIG. 8A. FIG. 8A illustrates four frames for ease of illustration, but the number of frames may be more or less than four. FIG. 8B illustrates a single frame 810 of the plurality of frames. Each of the frames 810 has a plurality of steps 820, such as steps 820a, 820b, 820c and 820d shown in FIG. 8B. FIG. 8B illustrates four steps for ease of illustration, but the number of steps may be more or less than four. In general, the amplitude of each step 820 within a frame 810 may vary as well as the time interval between steps. The difference in amplitude of adjacent steps 820 within each frame 810 may be fixed, or may not be fixed. The interval between adjacent steps 820 within each frame 810 may be fixed, or may not be fixed.

The shape of the waveform 800 within the frames 810 is different for different frames 810. For example, as shown in FIG. 8A, the shape of the waveform 800 within the frame 810a is different from the shape of the waveform 800 within the frames 810b, 810c and 810c. The shape of the waveform 800 within the frames 810 may be the same for different frames 810. For example, as shown in FIG. 8A, the shape of the waveform 800 within the frames 810b, 810c and 810c is the same.

Figure 9A:
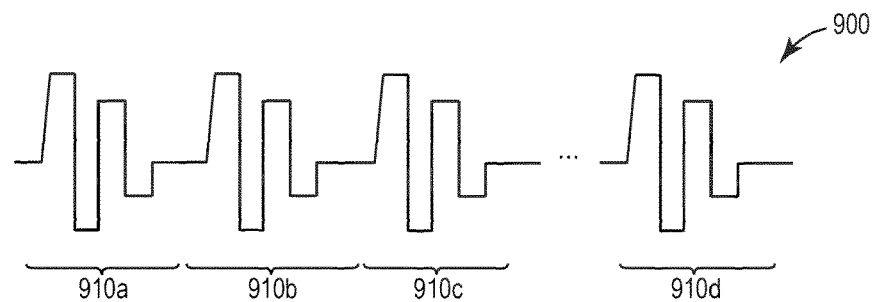
FIG. 9A illustrates an appropriate input waveform for providing parametric amplification according to another embodiment of the inventive concepts disclosed herein.
Figure 9B:
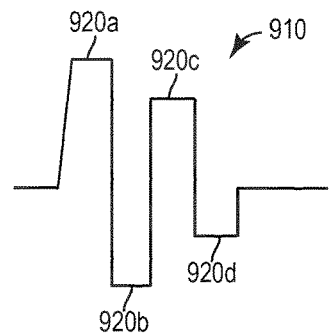
FIG. 9B illustrates a frame of the input waveform of FIG. 9A.

FIG. 9A illustrates an appropriate input waveform 900 for providing parametric amplification of a generated RF wave for a gyromagnetic NLTL, according to another embodiment, where the polarity of the waveform changes at each step. The input waveform may be divided into a plurality of frames 910, such as frames 910a, 910b, 910c and 910d shown in FIG. 9A. FIG. 9A illustrates four frames for ease of illustration, but the number of frames may be more or less than four. FIG. 9B illustrates a single frame 910 of the plurality of frames. Each of the frames 910 has a plurality of steps 920, such as steps 920a, 920b, 920c and 920d shown in FIG. 9B. FIG. 9B illustrates four steps for ease of illustration, but the number of steps may be more or less than four. In general, the amplitude of each step 920 within a frame 910 may vary as well as the time interval between steps. As shown in FIGS. 9A and 9B, the polarity of the pulse at steps 920 within the frames 910 changes from positive to negative and vice versa over a series of steps. For example, the polarity changes from positive in step 910a to negative in step 910b, and back to positive in step 910c. In particular, the parametric resonance leading to the increase of the amplitude of generated output RF oscillations occurs when the temporal intervals associated with the modulation have a fixed relationship with the period of the generated oscillations.

Figure 10A:
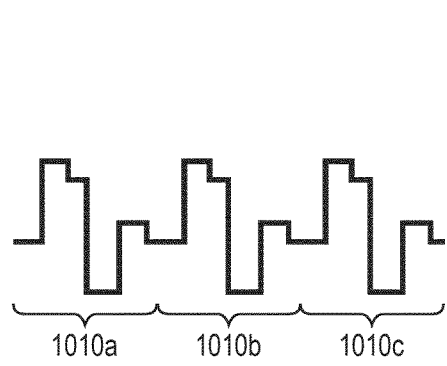
FIG. 10A illustrates an appropriate input waveform for providing parametric amplification according to another embodiment of the inventive concepts disclosed herein.
Figure 10B:
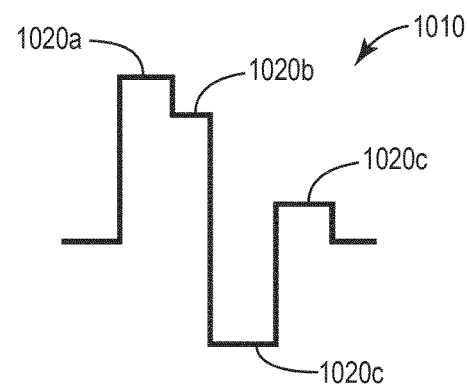
FIG. 10B illustrates a frame of the input waveform of FIG. 10A.

FIG. 10A illustrates an appropriate input waveform 1000 for providing parametric amplification of a generated RF wave for a gyromagnetic NLTL, according to another embodiment, which is a combination of that in FIGS. 8A and 9A, where the polarity of the waveform changes between some steps, but not at each step. The input waveform may be divided into a plurality of frames 1010, such as frames 1010a, 1010b, 1010c and 1010d shown in FIG. 10A. FIG. 10A illustrates four frames for ease of illustration, but the number of frames may be more or less than four. FIG. 10B illustrates a single frame 1010 of the plurality of frames. Each of the frames 1010 has a plurality of steps 1020, such as steps 1020a, 1020b, 1020c and 1020d shown in FIG. 10B. FIG. 10B illustrates four steps for ease of illustration, but the number of steps may be more or less than four.

Parametric Amplification in Nonlinear Pulse Forming Networks Based on Gyromagnetic NLTLs Parametric amplification of gyromagnetic oscillations may also be implemented without using a transient-modulated input pulse. It is possible when NLTL is implemented as a pulse forming or resonator-type structure, such as a Blumlein or Darlington-family circuit. In a similar fashion to the earlier embodiments, the structure includes NLTLs with a section filled with ferrite or other nonlinear magnetic material. The pulse forming or resonator-type structure supports multiple reflections from the boundaries in the structure, and is designed so that the transient fields created by multiple reflections amplify gyromagnetic oscillations, and thus allow for generation of long pulses.

In the parametric amplification, the required input waveform is modulated by the sharp transients. However, in the Blumlein or Darlington type circuit necessary transients modulating input waveform can be generated due to inherent reflections occurring in these pulse forming circuits. In this case the necessary transients (required for parametric amplification) can be internally produced due reflections.

Figure 11:
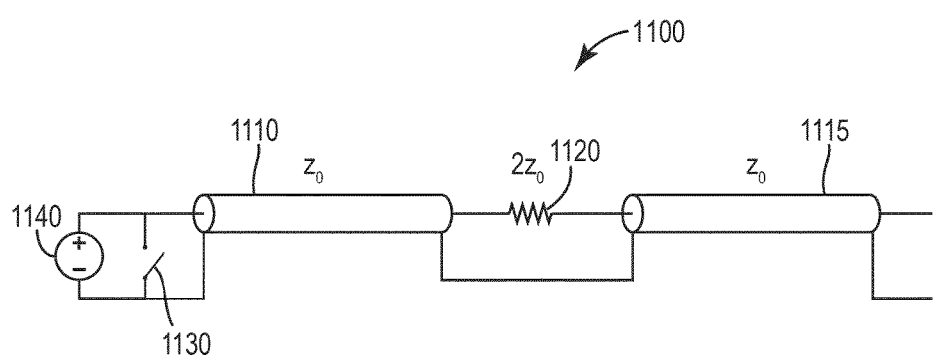
FIG. 11 is a schematic illustrating a pulse forming structure providing parametric amplification of gyromagnetic oscillations according to an embodiment of the inventive concepts disclosed herein.

FIG. 11 is a schematic illustrating a pulse forming structure 1100 providing parametric amplification of gyromagnetic oscillations according to an embodiment of the invention. The pulse forming structure 1100 has a Blumlein pulse forming structure, with a first NLTL transmission line 1110, a second NLTL transmission line 1115, and a load 1120 arranged between the first NLTL transmission line 1110 and the second NLTL transmission line 1115. The first NLTL transmission line 1010 and the second NLTL transmission line 1015 both have a characteristic impedance Z0, while impedance of the load is 2Z0, twice that of either the first NLTL transmission line 1010 or the second NLTL transmission line 1015. The pulse forming structure 1100 further includes a power supply 1140 to provide a voltage to the first NLTL transmission line 1110 and the second NLTL transmission line 1115, and a switch 1030 arranged to short circuit the first NLTL transmission line 1110 when in a closed position.

Figure 12:
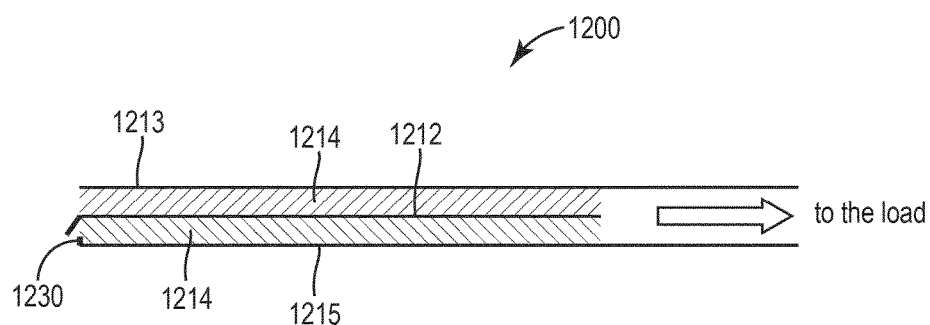
FIG. 12 illustrates an NLTL transmission line in a planar arrangement, according to an embodiment of the inventive concepts disclosed herein.

FIG. 12 illustrates a pulse forming structure 1200 in a planar arrangement with two parallel planer transmission lines going into the load. The pulse forming structure 1200 has a three plate structure with a top plate 1213, middle plate 1212 and a bottom plate 1215. All of the plates are conductive. A nonlinear magnetic material 1214, such as ferrite or other nonlinear magnetic material, is disposed between the top plate 1213 and the middle plate 1212. The nonlinear magnetic material 1214 is also disposed between the middle plate 1212 and the bottom plate 1215. The pulse forming structure 1200 further includes a switch 1230. When the switch 1230 is closed the middle plate 1212 and the bottom plate 1215 are connected and a pulse is provided to the load.

Figure 13A:
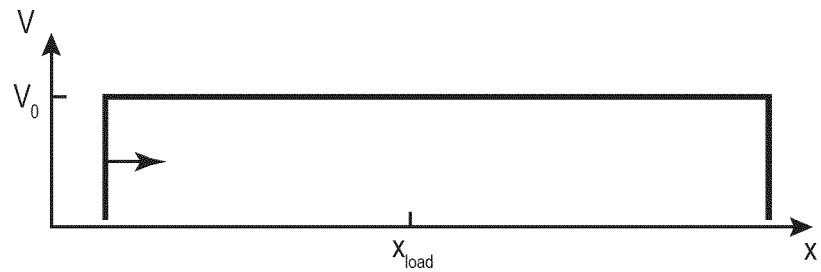
FIGS. 13A to 13C, illustrate a time sequence of a pulse propagating along the NLTLs of the pulse forming structure of FIG. 11.
Figure 13B:
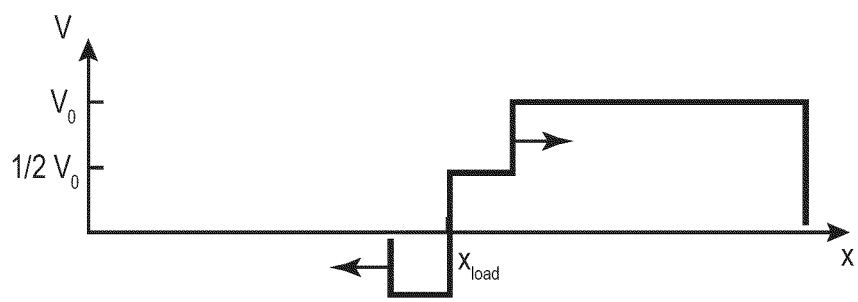
Figure 13C:
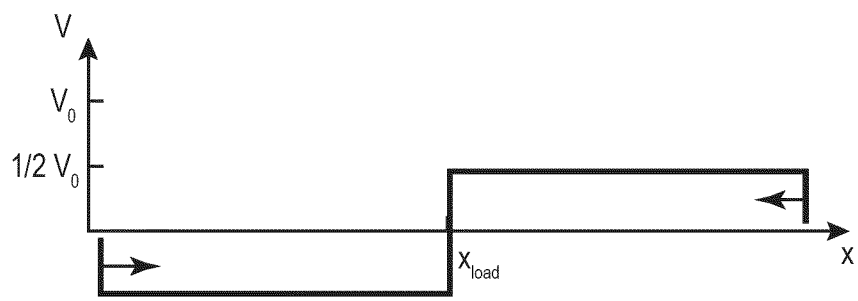

The pulse forming structure 1100 in FIG. 11 (or pulse forming structure 1200 in FIG. 12) operates to provide transient fields created by multiple reflections to amplify gyromagnetic oscillations as shown in FIGS. 13A to 13C, which show a time sequence from the time the switch 1130 is closed after the first NLTL transmission line 1110 and the second NLTL transmission line 1115 are charged to a voltage V0 by the power supply 1140. As shown in FIG. 13A, just after the switch 1130 is closed, the short circuit pulse with an amplitude V0 travels down the first NLTL transmission line 1110 toward the load 1120. As shown in FIG. 13B, because the characteristic impedance Z0 of the first NLTL transmission line 1110 is one-half the impedance of the load 1120, the voltage pulse is half reflected and half transmitted at the boundary between the first NLTL transmission line 1110 and the load 1120 resulting in two symmetrical opposite polarity voltage pulses which propagate away from the load 1120. As shown in FIG. 13C, the oppositely propagating voltage pulses reflect from the ends of the first NLTL transmission line 1110 and the second NLTL transmission line 1115, and return, ending the pulse. The transient fields created by multiple reflections amplify gyromagnetic oscillations, and thus allow for generation of long pulses.

The embodiments of the inventive concepts disclosed herein have been described in detail with particular reference to preferred embodiments thereof, but it will be understood by those skilled in the art that variations and modifications can be effected within the spirit and scope of the inventive concepts.

What is claimed is:

1. A radio frequency (RF) wave generator, comprising:
    a nonlinear transmission line having in order an input section, a magnetic section, and an output section, the magnetic section comprising a nonlinear magnetic material; and
    a pulse generator configured to provide an input pulse to the input section which is converted to an RF wave by the nonlinear transmission line, a waveform of the input pulse being such that the generated RF wave is parametrically amplified, the waveform of the input pulse comprises a step waveform including a plurality of frames, each frame including a plurality of steps,
    wherein the amplitude of the generated RF wave is substantially constant.

2. The generator of claim 1, wherein the nonlinear magnetic material comprises ferrite.

3. The generator of claim 1, wherein a difference in amplitude of adjacent steps in each frame is fixed.

4. The generator of claim 1, wherein a difference in amplitude of adjacent steps in each frame is not fixed.

5. The generator of claim 1, wherein an interval between adjacent steps in each frame is fixed.

6. The generator of claim 1, wherein an interval between adjacent steps in each frame is not fixed.

7. The generator of claim 1, wherein the shape of the waveform within the frames is different for different frames.

8. The generator of claim 1, wherein a polarity of adjacent steps within the frames changes is different for some adjacent steps, and the same for other adjacent steps.

9. The generator of claim 1, wherein a polarity of adjacent steps within the frames changes is different for all adjacent steps.

10. A pulse forming structure providing parametric amplification of gyromagnetic oscillations, comprising:
    a first gyromagnetic nonlinear transmission line (NLTL) comprising a nonlinear magnetic material;
    a second gyromagnetic NLTL transmission line;
    a load arranged between the first gyromagnetic NLTL transmission line and the second gyromagnetic NLTL transmission line;
    a power supply arranged to provide a voltage to the first gyromagnetic NLTL transmission line and the second gyromagnetic NLTL transmission line; and
    a switch arranged to short circuit the first NLTL transmission line when in a closed position such that a voltage pulse is generated to propagate in the first NLTL transmission line and the second NLTL transmission line to provide transient fields created by multiple reflections of the pulse to parametrically amplify gyromagnetic oscillations in the first NLTL transmission line and the second NLTL transmission line.

11. A method of parametrically amplifying a radio frequency (RF) wave, comprising:
    providing an input pulse to an input section of a nonlinear transmission line having in order the input section, a magnetic section, and an output section, the magnetic section comprising a nonlinear magnetic material; and
    converting the input pulse to an RF wave via the nonlinear transmission line, a waveform of the input pulse being such that the generated RF wave is parametrically amplified, the waveform of the input pulse comprises a step waveform including a plurality of frames, each frame including a plurality of steps,
    wherein the amplitude of the generated RF wave is substantially constant.

12. The method of claim 11, wherein a difference in amplitude of adjacent steps in each frame is not fixed.

13. The method of claim 11, wherein a polarity of adjacent steps within the frames changes is different for some adjacent steps, and the same for other adjacent steps.

14. The method of claim 11, wherein a polarity of adjacent steps within the frames changes is different for all adjacent steps.

* * * * *